(12) United States Patent
Kamei

(10) Patent No.: US 7,544,240 B2
(45) Date of Patent: Jun. 9, 2009

(54) COMPOSITION FOR FERROELECTRIC THIN FILM FORMATION, FERROELECTRIC THIN FILM AND LIQUID-JET HEAD

(75) Inventor: Hiroyuki Kamei, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 573 days.

(21) Appl. No.: 11/227,158

(22) Filed: Sep. 16, 2005

(65) Prior Publication Data
US 2006/0060902 A1    Mar. 23, 2006

(30) Foreign Application Priority Data

Sep. 17, 2004  (JP) .............................. 2004-272094
Jan. 11, 2005  (JP) .............................. 2005-004357

(51) Int. Cl.
*H01L 29/94*    (2006.01)
*C08K 5/00*    (2006.01)

(52) U.S. Cl. .................. 106/499; 257/295; 106/434; 310/363; 310/364; 347/70; 347/68

(58) Field of Classification Search .............. 106/499; 257/295
See application file for complete search history.

(56) References Cited

U.S. PATENT DOCUMENTS

2004/0007947 A1*  1/2004  Takahashi et al. ........... 310/363
2004/0013794 A1*  1/2004  Hashimoto et al. .......... 427/100

FOREIGN PATENT DOCUMENTS

JP    2000-119022 A    4/2000

* cited by examiner

Primary Examiner—Jerry Lorengo
Assistant Examiner—Yun Qian
(74) Attorney, Agent, or Firm—Sughrue Mion, PLLC

(57) ABSTRACT

A composition for ferroelectric thin film formation, comprising at least a colloidal solution containing metals serving as materials constituting a ferroelectric thin film, the colloidal solution having an average colloidal particle diameter of 1 to 100 nm, and obtaining a particle size distribution having two or more peaks; a ferroelectric thin film formed from the composition for ferroelectric thin film formation, and a liquid-jet head equipped with a piezoelectric element having the ferroelectric thin film.

4 Claims, 4 Drawing Sheets

PARTICLE SIZE BASED ON SCATTERING (nm)

COMPOSITION FOR FERROELECTRIC THIN FILM FORMATION, FERROELECTRIC THIN FILM AND LIQUID-JET HEAD

BACKGROUND OF THE INVENTION

1. Field of the Invention

This invention relates to a composition for ferroelectric thin film formation for use in forming a ferroelectric thin film, and also to a ferroelectric thin film, and a liquid-jet head.

2. Description of the Related Art

A ferroelectric thin film containing a crystal, typified by lead zirconate titanate (PZT), has spontaneous polarization, a high dielectric constant, an electro-optic effect, a piezoelectric effect, and a pyroelectric effect, and thus finds application in the development of a wide variety of devices such as piezoelectric elements. As methods for forming such a ferroelectric thin film, the MOD method, the sol-gel process, CVD (chemical vapor deposition), and sputtering, for example, are known (e.g., see Japanese Patent Application Laid-Open No. 2000-119022, "Prior Art"). A ferroelectric thin film is formed, for example, by coating a composition for ferroelectric thin film formation (a colloidal solution) on a subject material, then drying and firing the coating.

It is generally preferred that the ferroelectric thin film be a dense film. In recent years, a demand for such a dense film has been growing gradually. The composition for ferroelectric thin film formation, which is used to form a ferroelectric thin film, shows a tendency toward relatively low storage stability. The ferroelectric thin film is used for a piezoelectric element, etc., as mentioned above. If its film quality is poor, the piezoelectric characteristics of the piezoelectric element having the ferroelectric thin film fluctuate. In a liquid-jet head having the piezoelectric element as a piezoelectric actuator, moreover, such fluctuations in the piezoelectric characteristics of the piezoelectric element may cause variations in liquid ejection characteristics.

SUMMARY OF THE INVENTION

The present invention has been accomplished in the light of the above-described circumstances. It is an object of the invention to provide a composition for ferroelectric thin film formation, which can form a dense film and has excellent storage stability, and to provide a ferroelectric thin film, and a liquid-jet head.

A first aspect of the-present invention for attaining the above object is a composition for ferroelectric thin film formation, comprising at least a colloidal solution containing metals serving as materials constituting a ferroelectric thin film, the colloidal solution having an average colloidal particle diameter of 1 to 100 nm, and obtaining a particle size distribution having two or more peaks.

In the first aspect, a composition for ferroelectric thin film formation, which can form a dense film and has good storage stability, can be achieved.

A second aspect of the present invention is the composition for ferroelectric thin film formation according to the first aspect, characterized in that the average colloidal particle diameter is 1 to 30 nm.

In the second aspect, a composition for ferroelectric thin film formation, which can form a dense film more reliably and has better storage stability, can be achieved.

A third aspect of the present invention is the composition for ferroelectric thin film formation according to the first or second aspect, comprising the colloidal solution containing a complex having, as a nucleus, at least one of the metals serving as the materials constituting the ferroelectric thin film.

In the third aspect, a composition for ferroelectric thin film formation, which contains a complex showing at least one peak in a particle size distribution, enables a dense film to be formed, and excellent storage stability to be achieved.

A fourth aspect of the present invention is the composition for ferroelectric thin film formation according to any one of the first to third aspects, comprising the colloidal solution containing a cluster complex comprising a cluster of two or more complexes, each of the complexes having, as a nucleus, at least one of the metals serving as the materials constituting the ferroelectric thin film.

In the fourth aspect, a composition for ferroelectric thin film formation, which contains a cluster complex showing at least one peak in a particle size distribution, enables a dense film to be formed, and excellent storage stability to be achieved.

A fifth aspect of the present invention is the composition for ferroelectric thin film formation according to any one of the first to fourth aspects, comprising the colloidal solution containing a colloidal agglomerate comprising an agglomerate of complexes, each of the complexes having, as a nucleus, at least one of the metals serving as the materials constituting the ferroelectric thin film.

In the fifth aspect, a composition for ferroelectric thin film formation, which contains a colloidal agglomerate showing at least one peak in a particle size distribution, enables a dense film to be formed, and excellent storage stability to be achieved.

A sixth aspect of the present invention is the composition for ferroelectric thin film formation according to any one of the first to fifth aspects, characterized in that the metals serving as the materials constituting the ferroelectric thin film include at least Pb, Zr and Ti.

In the sixth aspect, a composition for ferroelectric thin film formation, which can form a PZT film dense in terms of film quality and has excellent storage stability, can be achieved.

A seventh aspect of the present invention is the composition for ferroelectric thin film formation according to the sixth aspect, characterized in that the metals serving as the materials constituting the ferroelectric thin film are Pb, Zr and Ti, and the colloidal solution contains colloidal particles comprising lead acetate, colloidal particles comprising lead acetate and zirconium acetylacetonate stabilized by water molecules, and colloidal particles comprising titanium alkoxides and lead acetate chelate-stabilized by amines.

In the seventh aspect, a composition for ferroelectric thin film formation, which contains colloidal particles comprising predetermined compounds, makes it possible to realize a composition for ferroelectric thin film formation which can form a PZT film dense in terms of film quality and which has excellent storage stability.

An eighth aspect of the present invention is the composition for ferroelectric thin film formation according to the seventh aspect, characterized in that the average colloidal particle diameter of the colloidal particles comprising lead acetate is 1 to 6 nm, the average colloidal particle diameter of the colloidal particles comprising lead acetate and zirconium acetylacetonate stabilized by water molecules is 1 to 10 nm, and the average colloidal particle diameter of the colloidal particles comprising titanium alkoxides and lead acetate chelate-stabilized by amines is 3 to 50 nm.

In the eighth aspect, a composition for ferroelectric thin film formation, which contains colloidal particles comprising predetermined compounds and having predetermined average colloidal particle diameters, makes it possible to realize a composition for ferroelectric thin film formation which can form a PZT film dense in terms of film quality and which has excellent storage stability.

A ninth aspect of the present invention is the composition for ferroelectric thin film formation according to the seventh or eighth aspect, characterized in that the colloidal particles comprising lead acetate, the colloidal particles, comprising lead acetate and zirconium acetylacetonate stabilized by water molecules, and the colloidal particles comprising titanium alkoxides and lead acetate chelate-stabilized by amines have the average colloidal particle diameter in increasing order.

In the ninth aspect, a composition for ferroelectric thin film formation, which contains colloidal particles comprising predetermined compounds and having predetermined average colloidal particle diameters, makes it possible to realize a composition for ferroelectric thin film formation which can form a PZT film dense in terms of film quality and which has excellent storage stability.

A tenth aspect of the present invention is a ferroelectric thin film formed from the composition for ferroelectric thin film formation according to any one of the first to ninth aspects.

In the tenth aspect, a ferroelectric thin film having stable piezoelectric characteristics can be achieved.

An eleventh aspect of the present invention is a liquid-jet head which is equipped with a piezoelectric element having the ferroelectric thin film according to the tenth aspect, as a piezoelectric actuator for jetting a liquid.

In the eleventh aspect, a liquid-jet head having stable liquid ejection characteristics and having high reliability can be achieved.

BRIEF DESCRIPTION OF THE DRAWINGS

For a more complete understanding of the present invention and the advantages thereof, reference is now made to the following descriptions in conjunction with the accompanying drawings.

DESCRIPTION OF THE PREFERRED EMBODIMENTS

Figure 1:
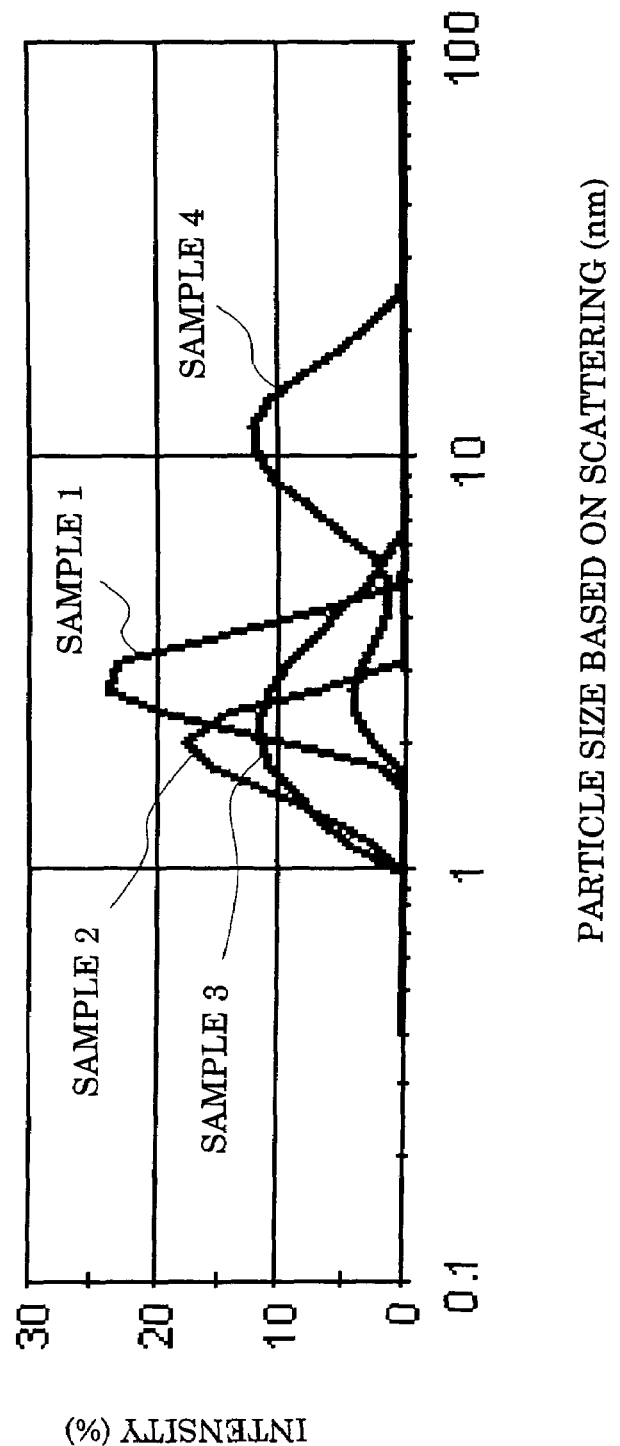
FIG. 1 is a graph showing colloidal particle size distributions.

The present invention will now be described in detail based on the embodiments offered below.

Embodiment 1

The composition for ferroelectric thin film formation according to the present invention is a colloidal solution (sol) for use in forming a ferroelectric thin film. Concretely, this composition comprises a colloidal solution containing metallic materials (for example, organometallic compounds) which become the materials constituting the ferroelectric thin film. The colloidal solution has an average colloidal particle diameter of 1 to 100 nm, and has the property of obtaining a particle size distribution having two or more peaks.

The composition for ferroelectric thin film formation according to the present invention comprises a colloidal solution containing a complex having, as a nucleus, at least one of the metals which become the materials constituting the ferroelectric thin film; a cluster complex comprising a cluster of two or more of the complexes; or a colloidal agglomerate comprising an agglomerate of these complexes. Examples of the complex are those in which the nucleus is a metal becoming the material constituting the ferroelectric thin film, and a ligand, for example, derived from alcohols, acetic acid, acethylacetonato, water (OH) or amines, is bound to the nucleus.

The above-mentioned composition for ferroelectric thin film formation, concretely, comprises a colloidal solution which has an average colloidal particle diameter, by the dynamic light scattering method, of 1 to 100 nm, preferably, 1 to 30 nm, and which obtains a particle size distribution having two or more peaks ascribed to these colloidal particles. Such a composition for ferroelectric thin film formation is coated on the subject material, dried and fired, whereby a ferroelectric thin film dense in terms of film quality can be formed. The composition for ferroelectric thin film formation also shows excellent storage stability.

If, for example, the metals contained in the composition for ferroelectric thin film formation are Pb, Zr and Ti, namely, in the case of a colloidal solution of a composition for PZT thin film formation, there are contained various colloidal particles, concretely, colloidal particles containing Pb alone (e.g., colloidal particles comprising lead acetate), colloidal particles containing Pb and Zr (e.g., colloidal particles comprising lead acetate and zirconium acetylacetonate stabilized by water molecules), and colloidal particles containing Pb and Ti (e.g., colloidal particles comprising titanium alkoxides and lead acetate chelate-stabilized by amines).

The composition for ferroelectric thin film formation (colloidal solution) containing colloidal particles containing Pb alone, colloidal particles containing Pb and Zr, and colloidal particles containing Pb and Ti shows excellent storage stability. By forming a PZT thin film from this composition for PZT thin film formation, the resulting PZT thin film is dense in terms of film quality.

In this composition for PZT thin film formation, moreover, the average colloidal particle diameters of the various colloidal particles contained in the solution are set at values in predetermined ranges. By so doing, a PZT thin film dense in terms of film quality can be formed more reliably, and the storage stability of the composition for PZT thin film formation can be further enhanced.

For example, the average colloidal particle diameter of the colloidal particles comprising lead acetate is preferably 1 to 6 nm, the average colloidal particle diameter of the colloidal particles comprising lead acetate and zirconium acetylacetonate stabilized by water molecules is preferably 1 to 10 nm, and the average colloidal particle diameter of the colloidal particles comprising titanium alkoxides and lead acetate chelate-stabilized by amines is preferably 3 to 50 nm.

Particularly in the respective colloidal particles contained in the composition for PZT thin film formation, the colloidal particles comprising lead acetate, the colloidal particles comprising lead acetate and zirconium acetylacetonate stabilized by water molecules, and the colloidal particles comprising titanium alkoxides and lead acetate chelate-stabilized by amines have the average colloidal particle diameter in increasing order. By incorporating these colloidal particles, a PZT thin film can be formed more reliably, and the storage stability of the composition for PZT thin film formation can be further enhanced.

There were prepared respective colloidal solutions (Pb; Sample 1, Zr; Sample 2, Ti; Sample 3) obtained by individually dispersing metallic materials constituting a PZT thin film as a ferroelectric thin film, concretely, organometallic compounds containing Pb, Zr and Ti (lead acetate trihydrate (Pb(CH$_3$COO)$_2$.3H$_2$O), zirconium acetylacetonate (Zr(CH$_3$COCHCOCH$_3$)$_4$), and titanium tetraisopropoxide (Ti((CH$_3$)$_2$CHO)$_4$)), and a colloidal solution (Sample 4) obtained by simultaneously dispersing the respective organometallic compounds containing Pb, Zr and Ti.

These colloidal solutions, named Samples 1 to 4, were measured for the colloidal particle size distribution including the particle size (nm) based on scattering intensity determined by the dynamic light scattering method, which is give as abscissas, and the intensity (%), which is given as ordinates, by use of a photon correlation spectroscope (PCS) "ZETA SIZER NANO, a product of MALVERN". The results are shown in FIG. 1. Separately, colloidal solutions were prepared by removing Pb (Sample 5), removing Zr (Sample 6), or removing Ti (Sample 7), from the colloidal solution of the same composition as Sample 4. These Samples 5 to 7 were also measured for the particle size and the colloidal particle size distribution under the same conditions as for the above-mentioned Samples 1 to 4. The results are shown in FIG. 2.

In the colloidal particle size distributions shown in FIG. 1, a peak indicating the colloidal particles contained in the colloidal solution as Sample 1 having Pb dispersed alone therein was present in the vicinity of about 3 nm, a peak indicating the colloidal particles contained in the colloidal solution as Sample 2 having Zr dispersed alone therein was present near about 2 nm, and a peak indicating the colloidal particles contained in the colloidal solution as Sample 3 having Ti dispersed alone therein was present in the vicinity of about 2 nm. On the other hand, a total of 2 peaks were present for the colloidal solution as Sample 4, i.e., a peak with an intensity of about 5% existent close to about 3 nm, and a peak with an intensity of about 10% present near about 10 nm, concretely, the two peaks representing the colloidal particles with a small particle size and the colloidal particles with an intermediate particle size.

Figure 2:
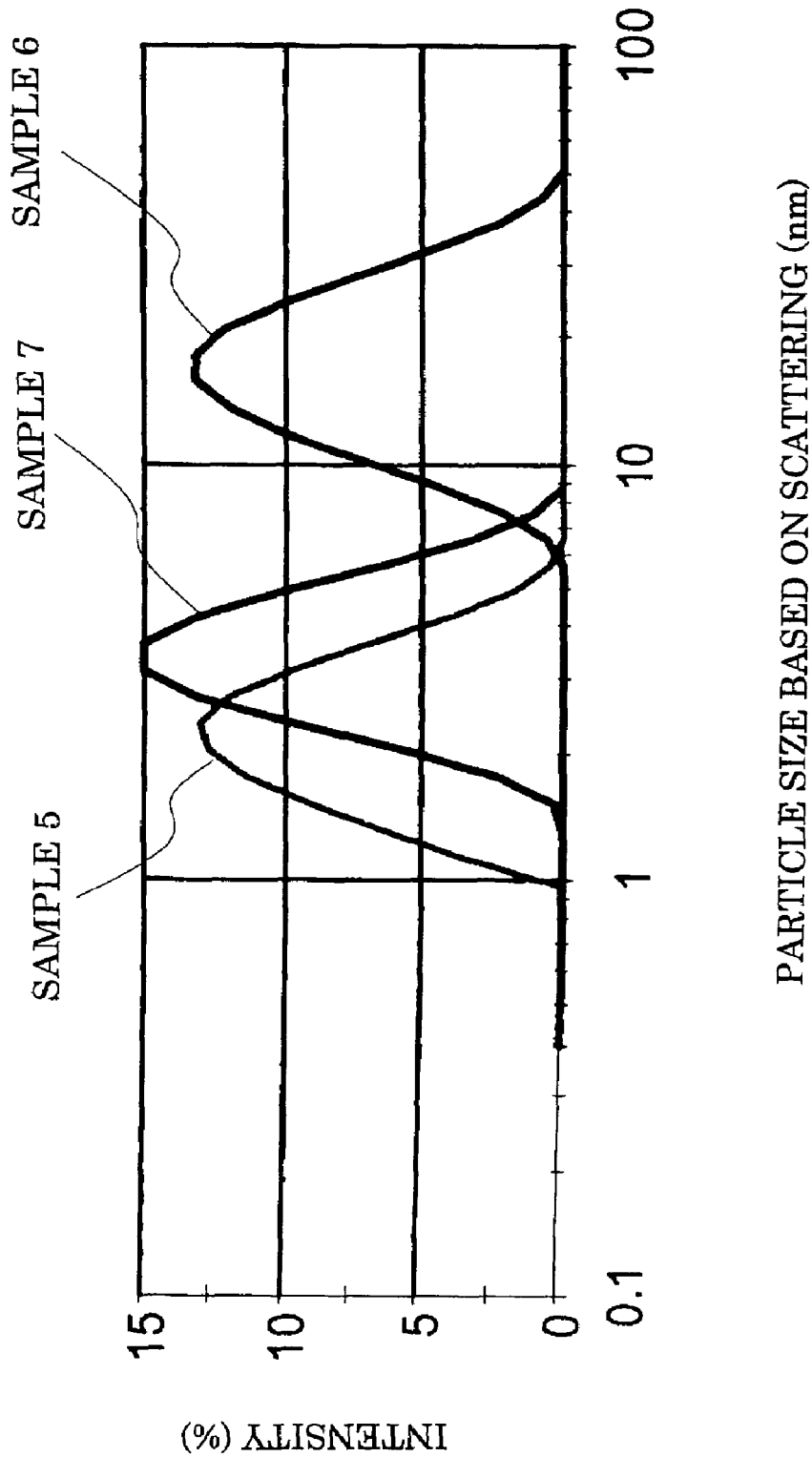
FIG. 2 is a graph showing colloidal particle size distributions.

In the colloidal particle size distributions shown in FIG. 2, the colloidal solution as Sample 5 containing Zr and Ti showed the presence of a single peak in the vicinity of about 2 nm. For Sample 6 containing Pb and Ti, a single peak was present near about 10 to 20 nm. Further, in connection with Sample 7 containing Pb and Zr, a single peak was present near about 3 nm.

A comparison between the colloidal particle size distributions in FIG. 1 and the colloidal particle size distributions in FIG. 2 showed that the peak representing the small particle size of the colloidal solution as Sample 4 (composition for PZT thin film formation), the peak of the colloidal solution as Sample 1, and the peak of the colloidal solution of Sample 7 were present at positions close to each other, and that the peak representing the intermediate particle size of Sample 4 (the colloidal particles corresponding to the peak present near about 10 nm), and the peak of the colloidal solution as Sample 6 were present at positions close to each other. Based on these findings, it became clear that the metal combination of Pb and Zr and that of Pb and Ti showed a strong interaction between the metals, while the metal combination of Zr and Ti showed little interaction between the metals.

In the light of the above results, the colloidal particles with a small particle size (2 to 4 nm) in the composition for PZT thin film formation (Sample 4) were either the colloidal particles comprising lead acetate, or the colloidal particles comprising lead acetate and zirconium acetylacetonate stabilized by water molecules, and the colloidal particles with an intermediate particle size (9 to 20 nm) in this composition were the colloidal particles comprising titanium alkoxides and lead acetate chelate-stabilized by amines. In other words, the composition for PZT thin film formation, as Sample 4, is mainly composed of the colloidal particles having a small particle size and the colloidal particles having an intermediate particle size, and the two peaks shown in the colloidal particle size distribution represent the colloidal particles having a small particle size and the colloidal particles having an intermediate particle size.

Moreover, a PZT thin film obtained from the composition for PZT thin film formation comprising the colloidal solution as Sample 4 was dense in film quality. This composition for PZT thin film formation could be stored for a long term of about 2 months under the ordinary temperature (2 or more months if stored at a low temperature).

According to the present invention, therefore, the colloidal solution, which is produced so as to have an average colloidal particle diameter of 1 to 100 nm and obtain two peaks in a colloidal particle size distribution, makes it possible to achieve a composition for ferroelectric thin film formation, which can form a ferroelectric thin film dense in film quality, and which has excellent storage stability.

The ferroelectric thin film formed from the above composition for ferroelectric thin film formation includes, for example, crystals of a ferroelectric material (piezoelectric material) such as lead zirconate titanate (PZT), or a relaxor ferroelectric having a metal, such as niobium, nickel, magnesium, bismuth or yttrium, added to such a ferroelectric material. Examples of the composition therefor are PbTiO$_3$ (PT), PbZrO$_3$ (PZ), Pb(Zr$_x$Ti$_{1-x}$)O$_3$ (PZT), Pb(Mg$_{1/3}$Nb$_{2/3}$)O$_3$-PbTiO$_3$ (PIN-PT) Pb(Zn$_{1/3}$Nb$_{2/3}$)O$_3$-PbTiO$_3$ (PZN-PT), Pb(Ni$_{1/3}$Nb$_{2/3}$)O$_3$-PbTiO$_3$ (PNN-PT), Pb(In$_{1/2}$Nb$_{1/2}$)O$_3$-PbTiO$_3$ (PIN-PT), Pb(Sc$_{1/2}$Ta$_{1/2}$)O$_3$-PbTiO$_3$ (PST-PT), Pb(Sc$_{1/2}$Nb$_{1/2}$)O$_3$-PbTiO$_3$ (PSN-PT), BiScO$_3$-PbTiO$_3$ (BS-PT), and BiYbO$_3$-PbTiO$_3$ (BY-PT).

The ferroelectric thin film of the present invention, as described above, is formed from the composition for ferroelectric thin film formation comprising the colloidal solution which has an average colloidal particle diameter of 1 to 100 nm and a particle size distribution having two or more peaks ascribed to such colloidal particles. Since the resulting thin film is dense in film quality, it can exhibit stable piezoelectric characteristics.

The above-described composition for ferroelectric thin film formation according to the present invention, and the ferroelectric thin film formed using this composition for ferroelectric thin film formation can be applied to the development of a wide variety of devices. Examples of their uses are, but not limited to, microactuators, filters, delay-lines, lead selectors, tuning-fork oscillators, tuning-fork clocks, transceivers, piezoelectric pickups, piezoelectric earphones, piezoelectric microphones, SAW filters, RF modulators, resonators, delay devices, multistrip couplers, piezoelectric accelerometers, and piezoelectric speakers.

Embodiment 2

Figure 3:
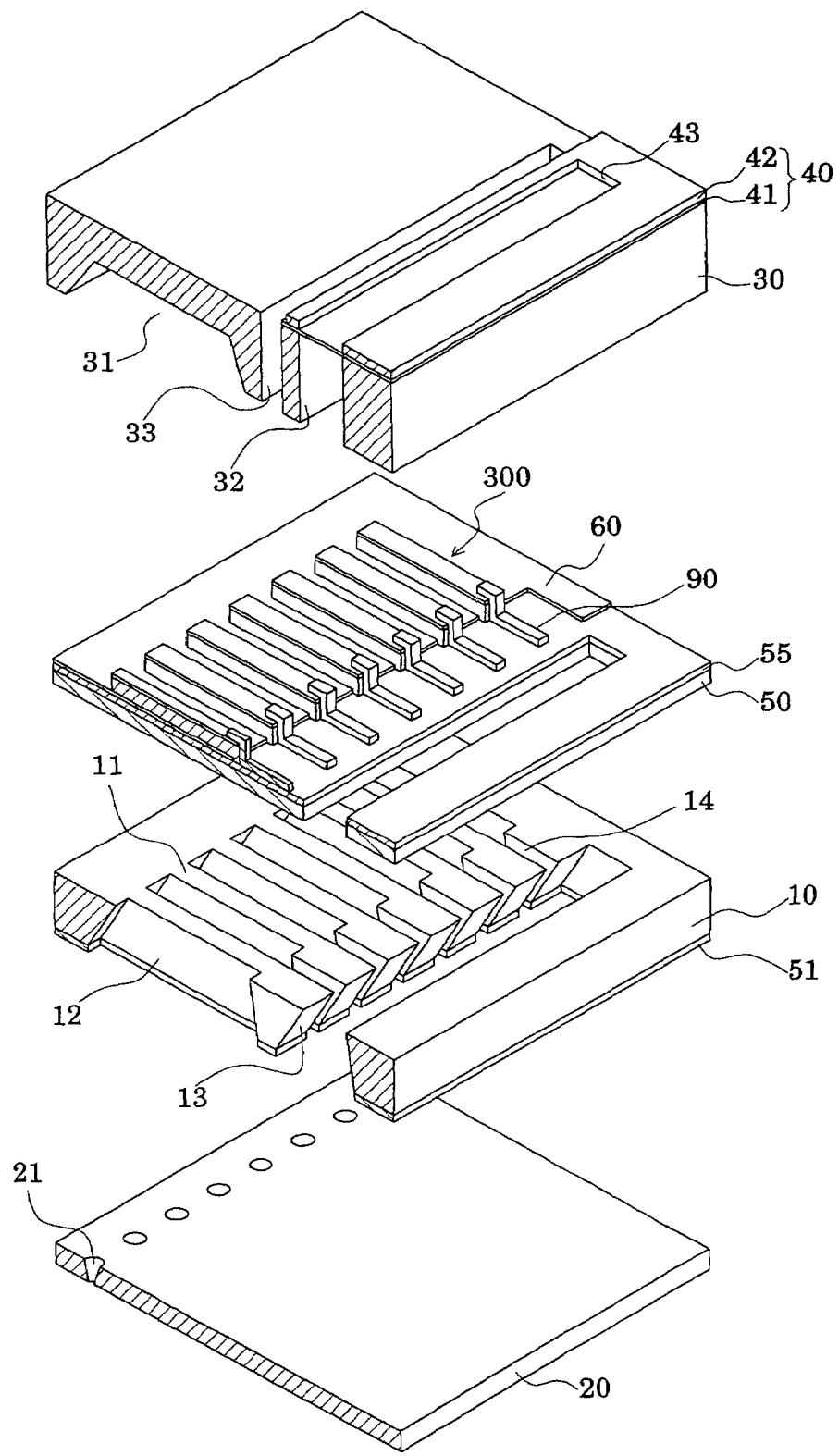
FIG. 3 is an exploded perspective view showing the outline of a recording head according to Embodiment 2 of the present invention.
Figure 4A:
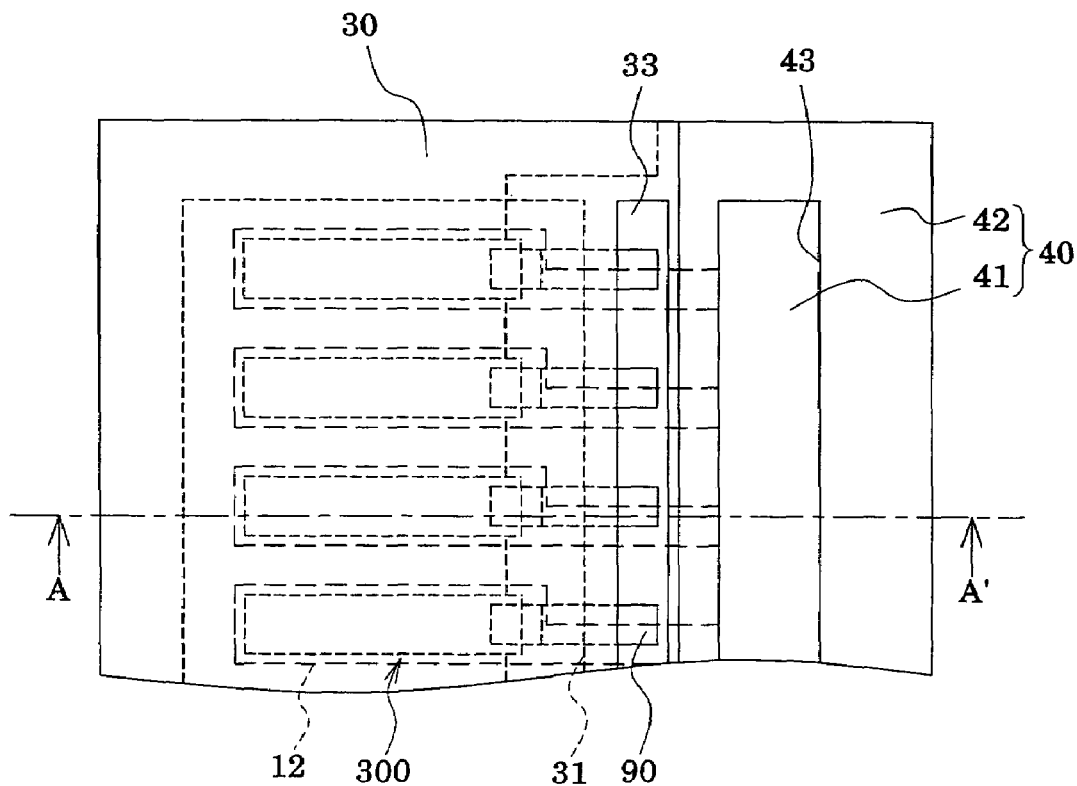
FIGS. 4A and 4B are, respectively, a plan view of the recording head according to Embodiment 2 of the present invention, and a sectional view taken along line A-A' in the plan view.
Figure 4B:
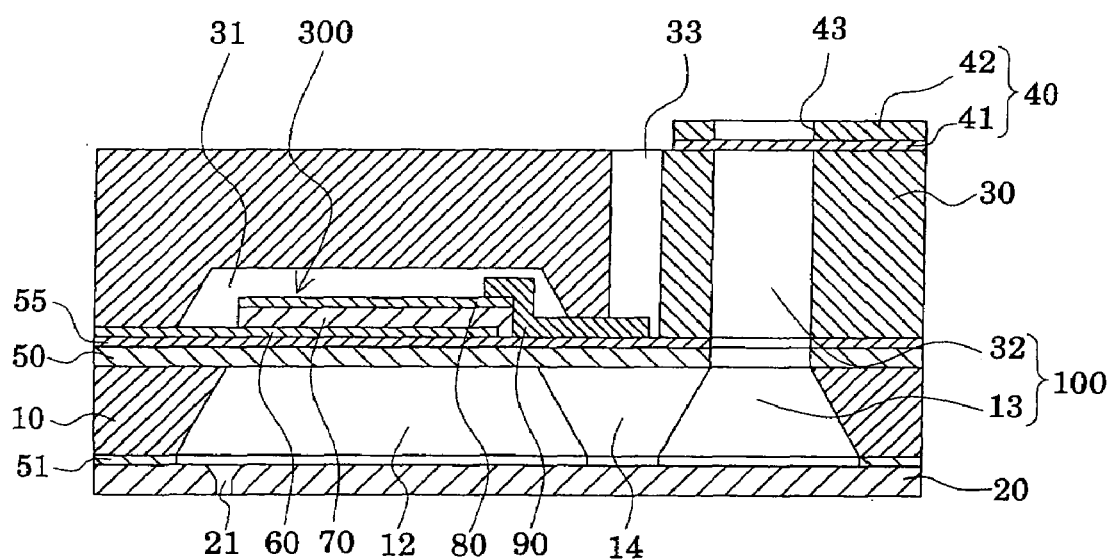

An ink-jet recording head, an example of a liquid-jet head in which the present invention has been applied to a piezoelectric actuator, will be described in detail with reference to FIGS. 3 and 4A, 4B. FIG. 3 is an exploded perspective view showing the outline of an ink-jet recording head, an example of a liquid-jet head. FIGS. 4A and 4B are, respectively, a plan view of the recording head in FIG. 3, and a sectional view taken along line A-A' in the plan view. As shown in FIG. 3 and FIGS. 4A and 4B, a passage-forming substrate 10, in the present embodiment, consists of a single crystal silicon substrate having a plane (110) of the plane orientation. An elastic film 50 comprising silicon dioxide ($SiO_2$) and having a thickness of 0.5 to 2 μm, formed beforehand by thermal oxidation, is present on one surface of the passage-forming substrate 10.

In the passage-forming substrate 10, a plurality of pressure generating chambers 12 partitioned by a plurality of compartment walls 11 are arranged parallel by anisotropic etching carried out on one surface side of the single crystal silicon substrate. A communicating portion 13, which communicates with a reservoir portion 32 of a protective plate 30 (to be described later), is formed outwardly of one end, in a direction (longitudinal direction) perpendicular to the direction of parallel arrangement (width direction) of the pressure generating chambers 12, of the pressure generating chamber 12. The communicating portion 13 and each of the pressure generating chambers 12 are brought into communication via an ink supply path 14 at one end portion in the longitudinal direction of each pressure generating chamber 12.

A mask film 51 used for formation of the pressure generating chambers 12 is provided on the opening surface side of the passage-forming substrate 10. Onto the mask film 51, a nozzle plate 20 having nozzle orifices 21 bored therein is secured via an adhesive agent or a heat sealing film. The nozzle orifices 21 communicate with a zone near the end of the pressure generating chambers 12 on the side opposite to the liquid supply paths 14.

An insulation film 55 having a thickness, for example, of about 0.4 μm is formed on the elastic film 50 placed on the side opposite to the opening surface of the passage-forming substrate 10. On the insulation film 55, a lower electrode film 60 with a thickness, for example, of about 0.2 μm, a ferroelectric thin film (piezoelectric layer) 70 with a thickness, for example, of about 1.0 μm, and an upper electrode film 80 with a thickness, for example, of about 0.05 μm are formed in a laminated state by a process (to be described later) to constitute a piezoelectric element 300. The ferroelectric thin film 70 in the present embodiment has been formed by a composition for ferroelectric thin film formation containing a colloidal solution which has an average colloidal particle diameter, by the dynamic light scattering method, of 1 to 100 nm, and which obtains a particle size distribution having two or more peaks ascribed to such colloidal particles.

The piezoelectric element 300 refers to a portion including the lower electrode film 60, the ferroelectric thin film 70, and the upper electrode film 80. Generally, one of the electrodes of the piezoelectric element 300 is used as a common electrode, and the other electrode and the ferroelectric thin film 70 are constructed for each pressure generating chamber 12 by patterning. A portion, which is composed of any one of the electrodes and the ferroelectric thin film 70 that have been patterned, and which undergoes piezoelectric distortion upon application of voltage to both electrodes, is called a piezoelectric active portion. In the present embodiment, the lower electrode film 60 is used as the common electrode for the piezoelectric elements 300, while the upper electrode film 80 is used as an individual electrode of each piezoelectric element 300. However, there is no harm in reversing their usages for the convenience of the drive circuit or wiring. In either case, it follows that the piezoelectric active portion is formed for each pressure generating chamber 12. Herein, the piezoelectric element 300 and a vibration plate, where displacement occurs by a drive of the piezoelectric element 300, are referred to collectively as a piezoelectric actuator. In the present embodiment, the elastic film 50, the insulation film 55, and the lower electrode film 60 act as the vibration plate.

The protective plate 30 is bonded via an adhesive agent onto a surface of the passage-forming substrate 10 where the piezoelectric elements 300 have been formed. The protective plate 30 has, in a region opposed to the piezoelectric elements 300, a piezoelectric element holding portion 31 which can ensure a space enough wide not to impede movements of the piezoelectric elements 300. Since the piezoelectric elements 300 are formed within the piezoelectric element holding portion 31, they are protected in a state in which they are substantially free from the influence of an external environment. The space of the piezoelectric element holding portion 31 may be, or need not be, sealed.

The protective plate 30 also has the reservoir portion 32 provided therein, which constitutes at least a part of a reservoir 100 serving as a common ink chamber for the respective pressure generating chambers 12. The reservoir portion 32 is brought into communication with the communicating portion 13 of the passage-forming substrate 10, as described above, to constitute the reservoir 100 serving as the common ink chamber for the respective pressure generating chambers 12. A through-hole 33, which penetrates the protective plate 30 in its thickness direction, is provided in a region between the piezoelectric element holding portion 31 and the reservoir portion 32 of the protective substrate 30. A lead electrode 90 leading from each piezoelectric element 300 has a portion in the vicinity of its end exposed within the through-hole 33.

Furthermore, a compliance plate 40, which consists of a sealing film 41 and a fixing plate 42, is bonded onto the protective plate 30. The fixing plate 42 is formed from a hard material such as a metal. A region of the fixing plate 42 opposed to the reservoir 100 defines an opening portion 43 completely deprived of the plate in the thickness direction. Thus, one surface of the reservoir 100 is sealed only with the sealing film 41 having flexibility.

With the ink-jet recording head of the present embodiment described above, ink is taken in from external ink supply means (not shown), and the interior of the head ranging from the reservoir 100 to the nozzle orifices 21 is filled with the ink. Then, according to drive signals from a drive IC (not shown), a drive voltage is applied between the lower electrode film 60 and the upper electrode film 80 corresponding to each pressure generating chamber 12 to warp and deform the elastic film 50, the insulation film 55, the lower electrode film 60, and the ferroelectric thin film 70. As a result, the pressure inside each pressure generating chamber 12 rises to eject ink droplets through the nozzle orifice 21.

In the above-described ink-jet recording head of the present embodiment, the ferroelectric thin film 70 is formed from the composition for ferroelectric thin film formation having the properties of having an average colloidal particle diameter, by the dynamic light scattering method, of 1 to 100 nm, and of obtaining a particle size distribution having two or more peaks ascribed to such colloidal particles. Thus, the ferroelectric thin film 70 is dense in film quality. Accordingly, the ink ejection characteristics of the head are stable, and the reliability of the head can be enhanced.

In the present embodiment, the ink-jet recording head for ejecting ink is taken for illustration as an example of the liquid-jet head. However, the present invention is not limited thereto. Examples of the liquid-jet head include recording heads for use in image recording devices such as printers, color material jet heads for use in the production of color filters such as liquid crystal displays, electrode material jet heads for use in the formation of electrodes for organic EL displays and FED (face emitting displays), and bio-organic material jet heads for use in the production of biochips. It should be understood that such changes, substitutions and alterations can be made therein without departing from the spirit and scope of the invention as defined by the appended claims.

What is claimed is:

1. A composition for ferroelectric thin film formation, comprising at least a colloidal solution containing metals serving as materials for making a ferroelectric thin film, said colloidal solution having an average colloidal particle diameter of 1 to 100 nm, and having a particle size distribution having two or more peaks,
   wherein the metals serving as the materials for making the ferroelectric thin film include at least Pb, Zr and Ti, and the colloidal solution comprises:
   (a) colloidal particles comprising lead acetate;
   (b) colloidal particles comprising lead acetate and zirconium acetylacetonate stabilized by water molecules; and
   (c) colloidal particles comprising titanium alkoxides and lead acetate chelate-stabilized by amines.

2. The composition for ferroelectric thin film formation according to claim 1, wherein the average colloidal particle diameter is 1 to 30 nm.

3. The composition for ferroelectric thin film formation according claim 1, wherein the average colloidal particle diameter of the colloidal particles comprising lead acetate is 1 to 6 nm, the average colloidal particle diameter of the colloidal particles comprising lead acetate and zirconium acetylacetonate stabilized by water molecules is 1 to 10 nm, and the average colloidal particle diameter of the colloidal particles comprising titanium alkoxides and lead acetate chelate-stabilized by amines is 3 to 50 nm.

4. The composition for ferroelectric thin film formation according claim 1, wherein the colloidal particles comprising lead acetate, the colloidal particles comprising lead acetate and zirconium acetylacetonate stabilized by water molecules, and the colloidal particles comprising titanium alkoxides and lead acetate chelate-stabilized by amines have the average colloidal particle diameter in increasing order.

* * * * *